(12) United States Patent
Queens et al.

(10) Patent No.: US 11,150,565 B2
(45) Date of Patent: Oct. 19, 2021

(54) METHODS FOR CONTROLLING LITHOGRAPHIC APPARATUS, LITHOGRAPHIC APPARATUS AND DEVICE MANUFACTURING METHOD

(71) Applicant: ASML NETHERLANDS B.V., Veldhoven (NL)

(72) Inventors: Rene Marinus Gerardus Johan Queens, Boise, ID (US); Wolfgang Helmut Henke, Kempen (DE)

(73) Assignee: ASML Netherlands B.V., Veldhoven (NL)

( * ) Notice: Subject to any disclaimer, the term of this patent is extended or adjusted under 35 U.S.C. 154(b) by 330 days.

(21) Appl. No.: 15/748,643

(22) PCT Filed: Aug. 9, 2016

(86) PCT No.: PCT/EP2016/068920
§ 371 (c)(1),
(2) Date: Jan. 29, 2018

(87) PCT Pub. No.: WO2017/025524
PCT Pub. Date: Feb. 16, 2017

(65) Prior Publication Data
US 2020/0081355 A1     Mar. 12, 2020

(30) Foreign Application Priority Data
Aug. 12, 2015  (EP) .................................... 15180726

(51) Int. Cl.
*G03F 7/20*     (2006.01)
*G03F 9/00*     (2006.01)

(52) U.S. Cl.
CPC ........ *G03F 9/7026* (2013.01); *G03F 7/70508* (2013.01); *G03F 9/7092* (2013.01)

(58) Field of Classification Search
CPC .. H04N 5/2256; H04N 13/239; H04N 13/254; H04N 5/2253; H04N 5/2257;
(Continued)

(56) References Cited

U.S. PATENT DOCUMENTS 6,521,889 B1   2/2003  Ina et al.
7,012,672 B2   3/2006  Van Rhee et al.
(Continued)

FOREIGN PATENT DOCUMENTS

TW      1248561        2/2006
WO   2015/104074       7/2015

OTHER PUBLICATIONS

International Search Report and Written Opinion dated Dec. 5, 2016 in corresponding International Patent Application No. PCT/EP2016/068920.

*Primary Examiner* — Mesfin T Asfaw
(74) *Attorney, Agent, or Firm* — Pillsbury Winthrop Shaw Pittman LLP

(57) ABSTRACT

A lithographic apparatus is used to manufacture a plurality of devices on a substrate. A height map is obtained representing a topographical variation across the substrate. Using the height map the apparatus controls imaging of a field pattern at multiple field locations across the substrate. The field pattern includes a plurality of individual device areas. For field locations near the substrate's edge, the height map data is used selectively so as to ignore topographical variations in one or more individual device areas. Whether a device area is to be ignored is determined at least partly based on the height map data obtained for the current exposure. Alternatively or in addition, the selection can be based on measurements made at the corresponding device area and field location on one or more prior substrates, and/or on the same substrate in a previous layer.

20 Claims, 6 Drawing Sheets

(58) Field of Classification Search
CPC .............. H04N 5/2258; H04N 13/271; H04N 2005/2255; H04N 5/23212; H04N 5/23229; H04N 5/3651; G03B 13/36; G03B 2205/0076; G03B 5/00; G03F 7/70625; G03F 7/094; G03F 9/7026; G03F 7/70633; G03F 9/7034; G03F 9/7003; G03F 7/70641; G03F 7/70783; G03F 7/70258; G03F 7/705; G03F 7/70558; G03F 9/7046; G03F 9/7084; G03F 7/70616; G03F 7/70508; G03F 7/0002; G03F 9/7092; G03F 7/0625; G01B 11/24; G01B 11/14; G01B 11/026; G01B 11/22; G01B 11/2441; G01B 11/26; G01B 7/16; G01B 11/02; G01B 11/04; G01B 11/06; G01B 11/0608; G01B 11/16; G01B 11/165; G01B 11/2408; G01B 11/27; G01B 11/30; G01B 11/306; G01B 15/02; G01B 21/32; G01B 3/205; G01B 5/20; G01B 5/30; G01B 7/28; G01B 9/02; G01B 9/02091; G01N 21/00

See application file for complete search history.

(56) References Cited

U.S. PATENT DOCUMENTS

| | | |
|---|---|---|
| 7,265,364 B2 | 9/2007 | Teunissen et al. |
| 8,842,293 B2 | 9/2014 | Den Boef et al. |
| 9,488,465 B2 | 11/2016 | Khuat Duy et al. |
| 2003/0202182 A1 | 10/2003 | Matsumoto et al. |
| 2004/0239905 A1 | 12/2004 | Van Rhee et al. |
| 2004/0257545 A1* | 12/2004 | Brinkhof .............. G03F 9/7026 355/53 |
| 2008/0221817 A1 | 9/2008 | Swaringen et al. |
| 2010/0233600 A1 | 9/2010 | Den Boef et al. |
| 2013/0128247 A1 | 5/2013 | Khuat Duy et al. |

* cited by examiner

METHODS FOR CONTROLLING LITHOGRAPHIC APPARATUS, LITHOGRAPHIC APPARATUS AND DEVICE MANUFACTURING METHOD

CROSS REFERENCE TO RELATED APPLICATIONS

This application is the U.S. national phase entry of PCT patent application no. PCT/EP2016/068920, which was filed on Aug. 9, 2016, which claims priority of European Patent EP application no. 15180726.0, which was filed on Aug. 12, 2015, and which is incorporated herein in its entirety by reference.

BACKGROUND

Field of the Invention

The present disclosure relates to lithographic apparatus. The disclosure relates in particular to the control of lithographic apparatus using height maps. The disclosure further relates to methods of manufacturing devices by lithography, and to data processing apparatuses and computer program products for implementing parts of such apparatus and methods.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a grid of adjacent target portions referred to as "fields" that are successively patterned. Known lithographic apparatus include so-called steppers, in which each field is irradiated by exposing an entire field pattern onto the field at one time, and so-called scanners, in which each field is irradiated by scanning the field pattern through a radiation beam in a given direction (the "scanning"-direction) while synchronously scanning the substrate parallel or anti-parallel to this direction.

The pattern is imaged onto the target portion of the substrate using lenses (or mirrors) forming a projection system. When imaging the pattern onto the substrate it is desirable to ensure that an uppermost surface of the substrate (i.e. the surface onto which the pattern is to be imaged) lies within the focal plane of the projection system.

The surface of a substrate on which a pattern should be projected is never perfectly flat, but presents many height deviations on both a large scale and smaller scale. Failure to adjust the focus of the projection system may result in poor patterning performance and consequently poor performance of the manufacturing process as a whole. Performance parameters such as critical dimension (CD) and CD uniformity in particular will be degraded by poor focus.

To measure these height deviations, height sensors are normally integrated in the lithographic apparatus. These are optical sensors used to measure and the vertical position of the uppermost surface of the substrate at points all across the substrate, after it has been loaded into the lithographic apparatus. This set of measurements is stored in some suitable form and may be referred to as a "height map". The height map is then used when controlling imaging of the pattern onto the substrate, to ensure that the radiation sensitive resist layer on each portion of the substrate lies in the focal plane of the projection lens. Typically the height of a substrate support bearing the substrate will be adjusted continuously during exposure of successive portions on a substrate. Examples of height sensors are disclosed in U.S. Pat. No. 7,265,364 B2, US 20100233600 A1 and US 2013128247 A. They do not need to be described in detail herein.

A known problem in lithography is that the substrate and/or the substrate support itself may suffer non-uniformity of processing in an edge region, leading to steep topographical variations towards the substrate edge. The term "edge roll-off" has been coined to refer to some types of edge topography phenomenon. Any non-device specific topography related to the edge region of the substrate should be considered as relevant for the present disclosure. For example there may be height steps in exposed fields that neighbor non-exposed edge fields. Edge roll-off will be referred to in the present disclosure purely as an example of such phenomena. These steep variations become represented in the height map that is used for control of the imaging operation. The normal control algorithms of the imaging operation may be unable to achieve the best focus across a field at the edge of the substrate, resulting in poor image quality, and poor yield of functional devices. Frequently the field area contains several device areas, because each functional device (the product being manufactured) requires only a fraction of the field area that can be printed in one scan or step. In such cases, yield of devices in parts of a field that are away for the edge can be negatively impacted, because the control algorithm is trying also to focus on other parts of the same field that are subject to edge roll-off. Often device areas in those other parts would never yield functional devices, so the non-edge device areas suffer poor yield for no benefit.

To improve yield of functional devices in fields at the substrate edge, it is known to control imaging while ignoring height map data for device areas within a certain radius of the substrate edge. In this way, by "sacrificing" device areas that are unlikely to yield a working product, better yield may be obtained in the device areas further from the edge.

It is desirable to improve the yield of lithographic manufacturing processes.

SUMMARY OF THE INVENTION

It is desirable to improve the yield of lithographic manufacturing processes. The inventors have recognized that the known solution sometimes results in sacrificing device areas that would have produced a working product under normal control algorithms, while saving others. In particular, the inventors have recognized that effects such as edge roll-off may not occur uniformly around the substrate periphery, but may be worse in some sectors than in others.

The invention in a first aspect provides a method of controlling a lithographic apparatus to manufacture a plurality of devices on a substrate, the method comprising:

(a) obtaining a height map representing a topographical variation across the substrate; and (b) using the height map to control imaging of a field pattern at multiple field locations across the substrate, the field pattern comprising a plurality of individual device areas, wherein for at least a subset of field locations in step (b) the height map data is used selectively so as to ignore topographical variations in one or more of said individual device areas, and wherein the method further comprises:

(c) selecting whether a device area is to be ignored in step (b) based at least partly on measurements made at the corresponding device area and field location on one or more substrates.

The measurements used in determining whether a device area is to be ignored may be height measurements of the same substrate, such as the ones in the height map obtained for the current exposure. Alternatively or in addition, the selection can be based on measurements made at the corresponding device area and field location on one or more prior substrates, and/or on the same substrate in a previous layer. The measurements may be height measurements (from which a prediction of focus performance can be inferred) or data indicating focus performance actually obtained.

The invention in a second aspect provides an apparatus for controlling lithographic processing in which substrates are subjected to lithographic processing, the apparatus comprising a data processing apparatus programmed to perform the steps of:

receiving measurements of substrates that have been subjected to lithographic processing over a plurality of field areas, each field area comprising a plurality of device areas;

for at least a subset of field locations using said measurements to select one or more of said device areas to be ignored in the operation of a lithographic apparatus; and providing recipe data identifying for each of said field locations the device areas for which topographical variations are to be ignored, when controlling imaging of a pattern onto a substrate.

The invention yet further provides a computer program product comprising machine readable instructions for causing a general purpose data processing apparatus to perform the steps of the method of the first aspect of the invention as set forth above.

The invention yet further provides a computer program product comprising machine readable instructions for causing a general purpose data processing apparatus to implement the apparatus for controlling perform the steps of the method of the second aspect of the invention as set forth above.

The computer program product in either case may comprises a non-transitory storage medium.

Further features and advantages of the invention, as well as the structure and operation of various embodiments of the present invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which.

DETAILED DESCRIPTION OF EXEMPLARY EMBODIMENTS

Figure 1:
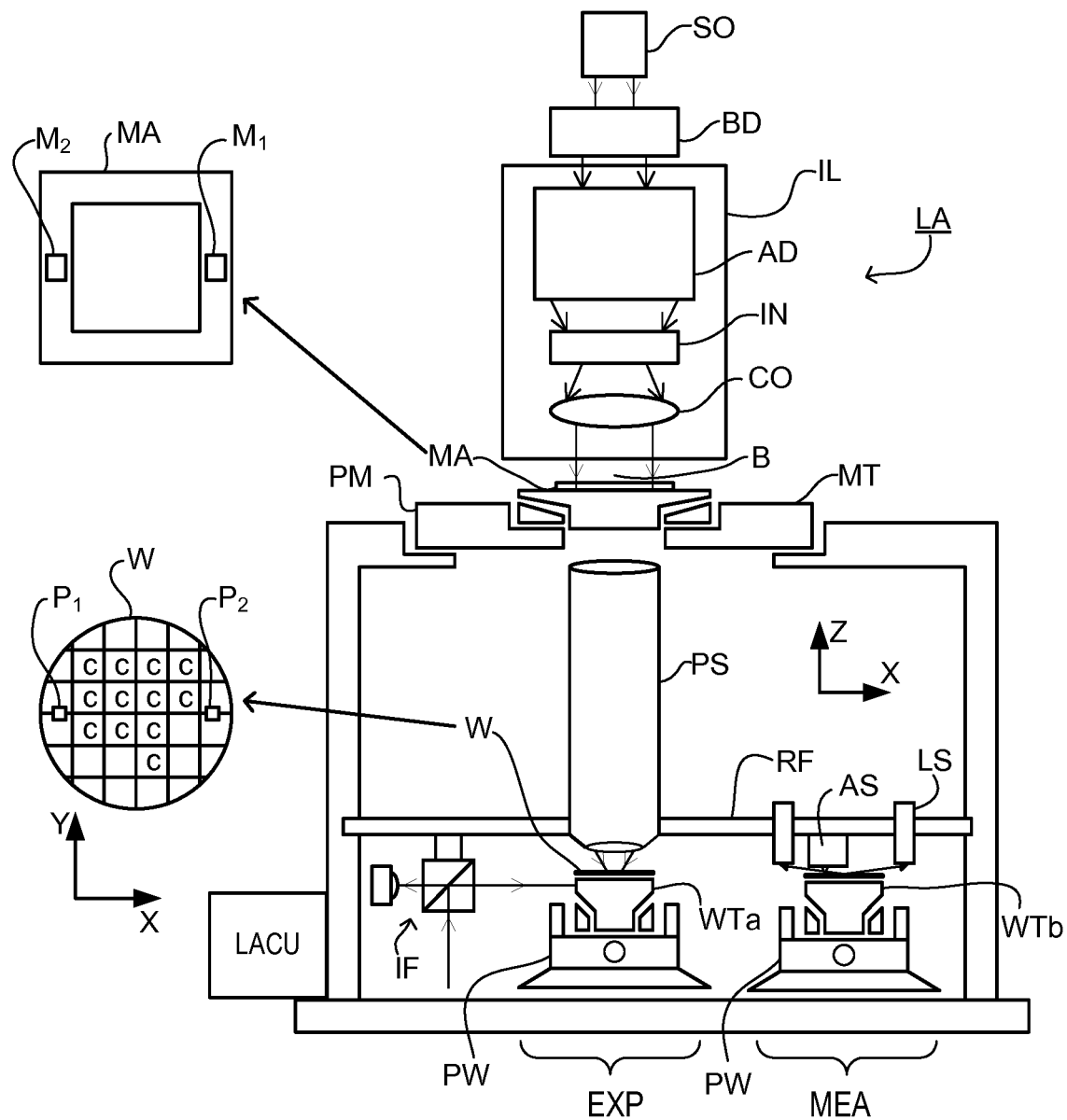
FIG. 1 depicts a lithographic apparatus according to an embodiment of the invention.

FIG. 1 schematically depicts a lithographic apparatus LA. The apparatus comprises:

an illumination system (illuminator) IL configured to condition a radiation beam B (e.g. UV radiation or EUV radiation).

a support structure (e.g. a mask table) MT constructed to support a patterning device (e.g. a mask or reticle) MA and connected to a first positioner PM configured to accurately position the patterning device in accordance with certain parameters;

a substrate table (e.g. a wafer table) WTa or WTb constructed to hold a substrate (e.g. a resist coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device (or a number of devices) being created in the target portion, such as an integrated circuit. The patterning device may be transmissive or reflective. Examples of patterning devices include masks, programmable mirror arrays, and programmable LCD panels.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as G-outer and G-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (fields), and/or between device areas (dies) within target portions. These are known as scribe-lane alignment marks, because individual product dies will eventually be cut from one another by scribing along these lines. Similarly, in situations in which more than one die is provided on the mask MA, the mask alignment marks may be located between the dies.

The depicted apparatus could be used in at least one of the following modes:

1. In step mode, the mask table MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.
2. In scan mode, the mask table MT and the substrate table WTa/WTb are scanned synchronously while a pattern imparted to the radiation beam is projected onto a target portion C (i.e. a single dynamic exposure). The velocity and direction of the substrate table WTa/WTb relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA in this example is of a so-called dual stage type which has two substrate tables WTa and WTb and two stations—an exposure station and a measurement station—between which the substrate tables can be exchanged. While one substrate on one substrate table is being exposed at the exposure station EXP, another substrate can be loaded onto the other substrate table at the measurement station MEA so that various preparatory steps may be carried out. The preparatory steps may include mapping the surface height of the substrate using a height sensor LS and measuring the position of alignment marks on the substrate using an alignment sensor AS. The measurement is time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
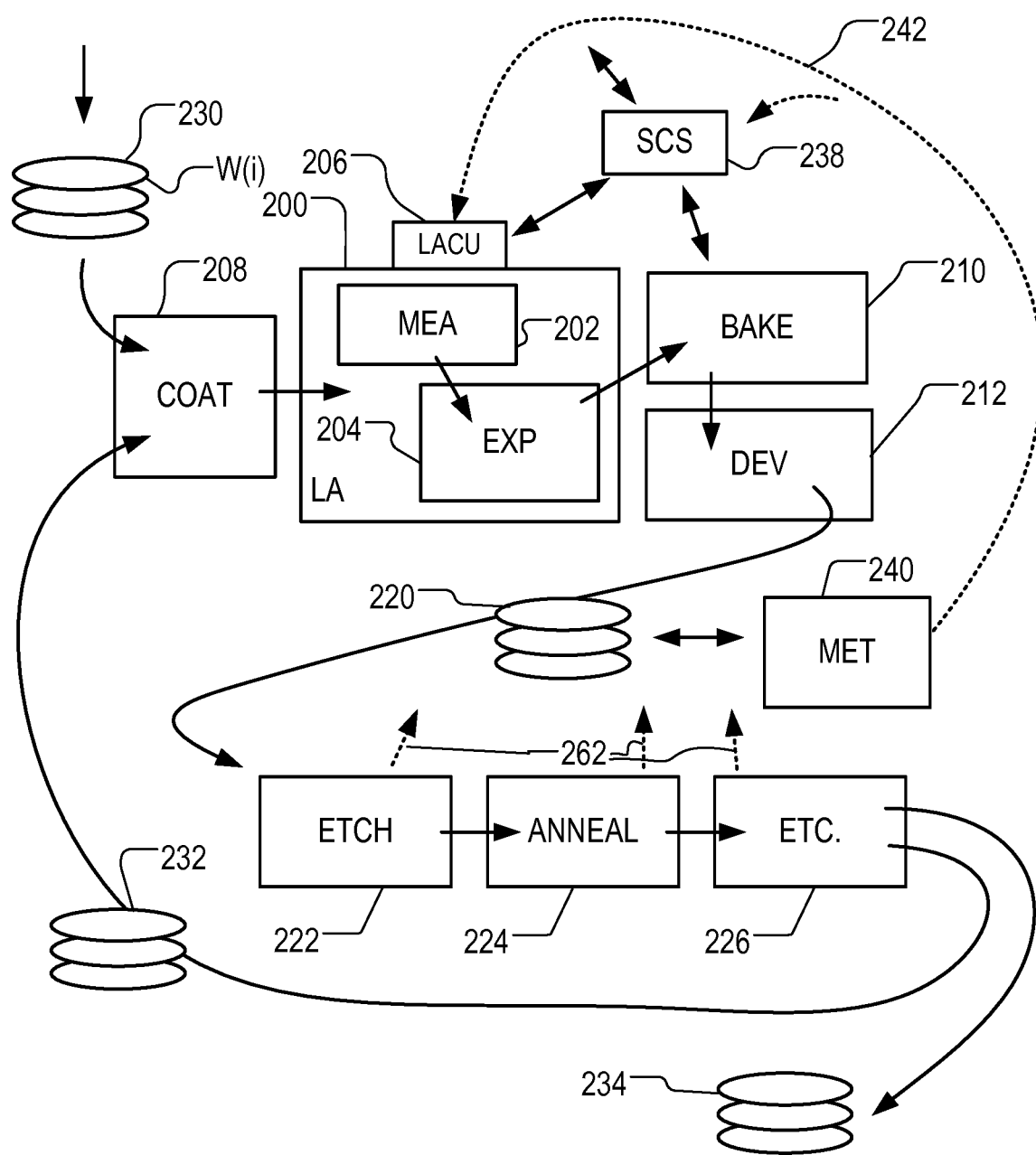
FIG. 2 shows schematically the use of the lithographic apparatus of FIG. 1 together with other apparatuses forming a production facility for semiconductor devices.

FIG. 2 at 200 shows the lithographic apparatus LA in the context of an industrial production facility for semiconductor products. Within the lithographic apparatus (or "litho tool" 200 for short), the measurement station MEA is shown at 202 and the exposure station EXP is shown at 204. The control unit LACU is shown at 206. Within the production facility, apparatus 200 forms part of a "litho cell" or "litho cluster" that contains also a coating apparatus 208 for applying photosensitive resist and other coatings to substrate W for patterning by the apparatus 200. At the output side of apparatus 200, a baking apparatus 210 and developing apparatus 212 are provided for developing the exposed pattern into a physical resist pattern.

Once the pattern has been applied and developed, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

The whole facility may be operated under control of a supervisory control system 238, which receives metrology data, design data, process recipes and the like. Supervisory control system 238 issues commands to each of the apparatuses to implement the manufacturing process on one or more batches of substrates.

Also shown in FIG. 2 is a metrology apparatus 240 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. As is also well known, the metrology results 242 from the apparatus 240 can be used to maintain accurate performance of the patterning operations in the litho cluster, by control unit LACU 206 making small adjustments over time, thereby minimizing the risk of products being made out-of-specification, and requiring re-work. Of course, metrology apparatus 240 and/or other metrology apparatuses (not shown) can be applied to measure properties of the processed substrates 232, 234, and incoming substrates 230.

Figure 3:
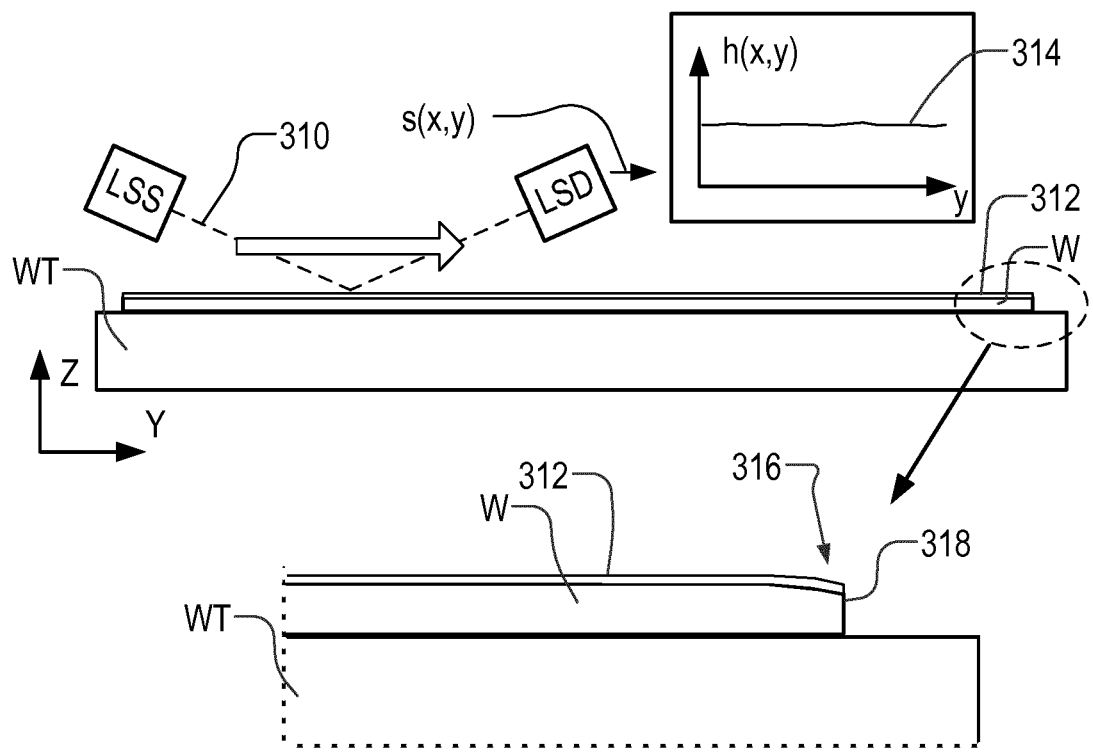
FIG. 3 illustrates schematically the operation of a height sensor and the phenomenon of edge roll-off in the lithographic apparatus of FIG. 1.

Referring now to FIG. 3, it was mentioned above that a preliminary step in the operation of a lithographic apparatus is for a map of wafer height to be obtained by measuring surface position in the Z direction against X-Y position. This height map may be obtained for example using the height sensor LS in the lithographic apparatus, after the substrate has been clamped to one of the substrate supports WTa and WTb. The height map is used during patterning to achieve accurate focusing of an image of the patterning device MA onto the substrate. A substrate support is labeled WT, and carries a substrate W. The height sensor LS is in this example an optical sensor, comprising a source side optics LSS, and detector optics LSD. Other types of height sensors including for example air gauge sensors are known, which may be used instead of or in combination with the optical sensor.

In operation, source side optics LSS generates one or more beams of radiation (light) 310 that impinge onto a substrate W. Substrate W typically has different layers formed on it, and typically many more layers than are illustrated here. A top layer will normally be the resist layer 312 in which a pattern is to be formed. Below that will be an anti-reflective coating and below that will be potentially many layers of device features formed in different layouts and materials.

The beam of light 310 is reflected by the substrate and detected by detector side optics LSD to obtain one or more signals S(x,y) from which a measurement of the surface height at a position (x,y) on the substrate can be derived. By measuring height at numerous positions across the substrate, a height map h(x,y) can be obtained by a suitable processor in control unit LACU. The height map is then used when the substrate is in the exposure station EXP to control focus and other parameters in the operation of the lithographic apparatus. The details of these optics for height sensing, as well as the associated signal processing, are known in the art and described for example in the prior publications mentioned in the introduction. They will not be described herein in detail. The radiation used in the present examples may be monochromatic, polychromatic and/or broadband. It may be P- or S-polarized, circularly polarized and/or unpolarized.

The height map h(x,y) can take any suitable form. In a simple embodiment, the height map comprises a two-dimensional array of sample values indexed by the X and Y coordinates of position across the substrate. In other embodiments, the height values could be expressed by parametric curves, fitted to measured sample values. A graph 314 of h(x,y) in FIG. 3 represents height values in a single slice, for example extending in the Y direction with a certain X value.

Over most of the substrate surface, height variations are relatively gentle, both in extent and their degree of localization (spatial frequency). In the enlarged detail at the bottom of FIG. 3, however, it is seen that a steeper variation may arise in a region 316 towards the edge 318 of the substrate, in a peripheral region of the substrate. The causes of this variation near the substrate edge have many causes. Non-uniformity leading to edge effects may arise in the manufacture of the original substrate, and even in the manufacture of the substrate support itself. Subsequently, variations in etching, CMP and the like may accumulate layer-by-layer so that a phenomenon known as "edge roll-off" becomes quite pronounced.

As will be illustrated below, the short-range and large amplitude of the edge roll-off undesirably impacts the focusing of the image, and yield of working products can be impacted negatively as a result. Although the term "roll-off" naturally implies a downward slope in surface height towards the edge, as illustrated in FIG. 3, an upward slope could occur, with the same results. Furthermore, although the phenomenon of edge roll-off will be referred to in the present disclosure as an example, the disclosure applies equally to any non-device specific topography related to the edge region of the substrate. For example there may be height steps in exposed fields that neighbor non-exposed edge fields.

Figure 4:
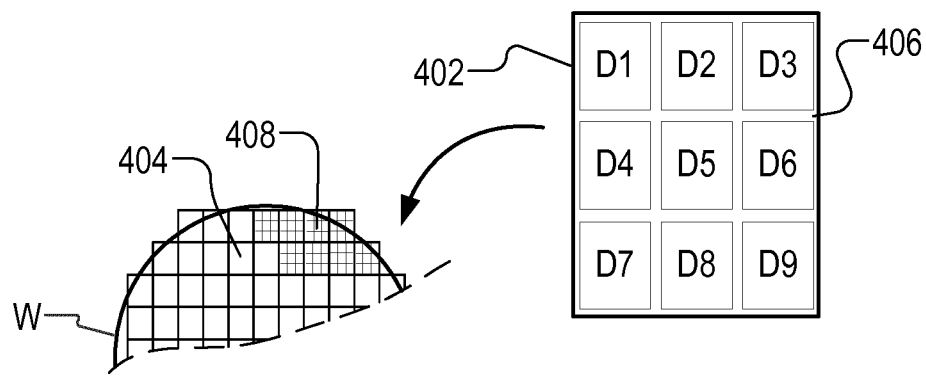
FIG. 4 illustrates a layout of field areas and device areas on a substrate being processed by the lithographic apparatus in the system of FIGS. 1 and 2.

FIG. 4 illustrates an example substrate W to which a field pattern 402 is to be applied. In the description of FIG. 1 above, each target portion C can be regarded as a field area 404 to which the field pattern is to be applied. The lithographic apparatus LA is controlled to apply the field pattern to many field areas, forming a grid. As shown in the enlarged detail, each field pattern may in fact comprise an array of two or more device patterns. In the illustration, a 3-by-3 array includes nine device areas D1 to D9. The device patterns device areas D1-D9 will typically be identical, but this is not necessarily the case. Each field area on the substrate then comprises an array of device areas. In the finished substrates 234 in the production facility of FIG. 2, each device area should carry a working product. These device areas are then cut (diced) into individual product dies for packaging. Spaces 406 between device areas allow for this cutting, and are referred to as scribe lanes.

As seen in FIG. 4, some field areas 408 extend over the substrate edge. In a product where the whole field area contains a single device area (die), these fields would not be exposed, because the device pattern would be incomplete and the die could never yield a working product. In the case of a field pattern that contains multiple device patterns, however, field area 408 is patterned, because a number of working product dies may be produced.

Figure 5:
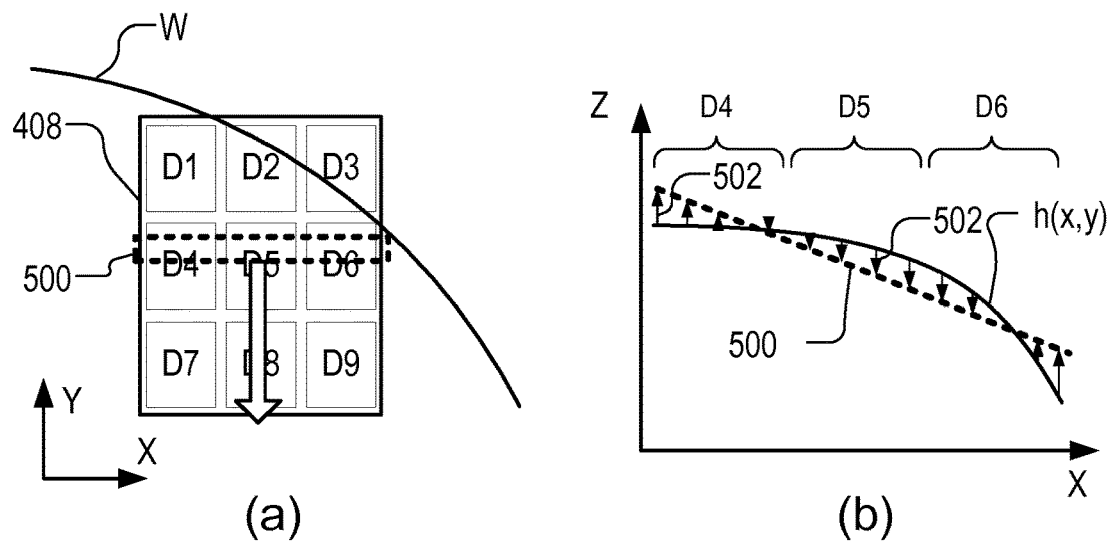
FIG. 5 illustrates the problem of loss of yield caused by edge roll-off in a normal focus control algorithm.

As illustrated in FIG. 5, however, edge roll-off may reduce the yield of dies that are near the edge. FIG. 5 (a) illustrates the patterning of field area 408 in a scanning mode of operation. As explained above reference to FIG. 1, a scanning mode of operation involves a progressive application of the field pattern, by scanning movements. A slit 500 represents the portion of the field area that is imaged at one instant. The slit 500 moves over the field area progressively applying each part of the pattern in turn. The scanning direction is conventionally considered the Y axis, as illustrated. By adopting this mode of operation, the field width can be maximized for a given projection system PS. Also, control of focus and other imaging parameters can be varied during the scanning to optimize the imaging at each part of the field area. Nevertheless, the projection system and positioning systems are limited in their ability to focus each portion of the field area individually to suit local topographic variations.

FIG. 5(b) illustrates the problem of controlling focus across the slit 500 in the presence of edge roll-off. The height map (for a given Y value) is shown at h(x,y). In an example, the projection system and focus control algorithm can only focus the image in a plane over the slit 500. A focus control algorithm seeks to average all the height values in the slit area to achieve a best compromise focal plane. Consequently, because of the extreme curvature of the surface represented in the height map in the presence of edge roll-off, large focus errors 502 are observed. These focus errors cause the pattern to be imperfectly formed in the resist, and the device areas D4, D5, D6 (in this example) do not yield working products. It may be observed that the device area D4 is actually outside the region affected by edge roll-off, but yield in that device area has been lost because focus control is influenced by edge roll-off in the height map for device areas D5 and D6. In other words, a potentially yielding die has been lost.

Figure 6:
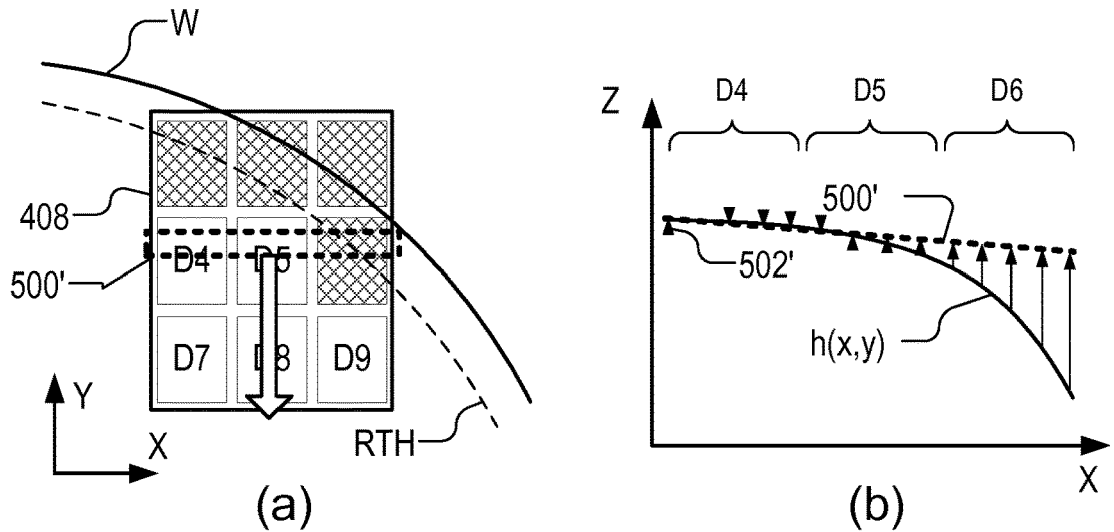
FIG. 6 illustrates a known solution to the problem of FIG. 5.

FIG. 6 illustrates a known solution to the problem of yield loss in the situation illustrated by FIG. 5. At FIGS. 6(a) and (b) we see the same field area 408 and device areas D1-D9, and we see the same height map h(x,y) with edge roll-off in the device areas D5 and especially D6. In the method of FIG. 6, focusing of the image in slit 500' is controlled by a modified algorithm that ignores height map data corresponding to device areas in a peripheral zone of the substrate. Specifically, a threshold radius RTH is defined. All device areas that are wholly or partially outside that radius are excluded from the focus calculations. The device areas D1-D3 and D6 are excluded in the illustrated example.

Referring now to FIG. 6(b), we see the beneficial result of excluding height values for device area D6 from the focus control at the slit position shown. The focus errors 502' in device area D4 are now greatly reduced, and a working product die can be expected to be produced. Possibly device D5 may yield a working product die too. Conversely, the die corresponding to device area D6 is sacrificed, but it is assumed that this die was likely to be non-yielding in any case.

The example of FIGS. 5 and 6 suggests that the known solution might yield two working dies where three dies were non-yielding under conventional control. The inventors have recognized, however, that in practice the known solution does not necessarily bring the expected benefits, and may sacrifice dies that would have been yielding under the conventional control.

Figure 7:
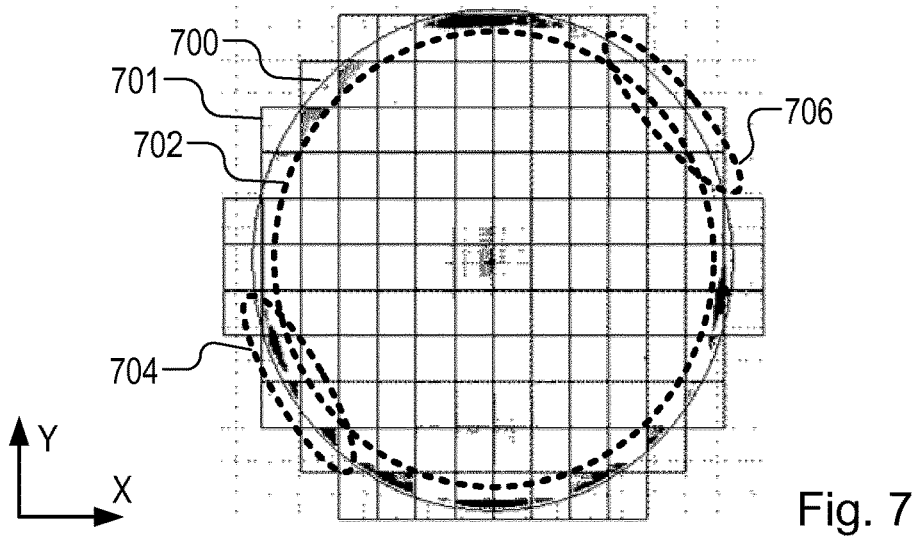
FIG. 7 illustrates a non-uniform distribution of edge roll-off in an example height map.

FIG. 7 illustrates one cause of this loss of yield. A wafer outline 700 and field grid 701 are overlaid with shades representing a focus error obtained by comparing a height map of a real wafer with the focus height obtained by the conventional focus algorithm. In an inner region 702, the lack of shading indicates relatively good focusing performance (low focus error). In a first peripheral region 704 the dark shading indicates high focus errors due to edge roll-off. Poor yield of dies may be expected in the affected fields. Improved yield can be expected, by use of the solution of FIG. 6. In another peripheral region 706, however, the edge roll-off is not so pronounced, and reasonable yield of working dies could be expected from the conventional focusing method of FIG. 5. Using the method of FIG. 6, however, the inventors have recognized that yield in the region 706 may actually be reduced by the method of FIG. 6, because potentially yielding dies are sacrificed.

Figure 8:
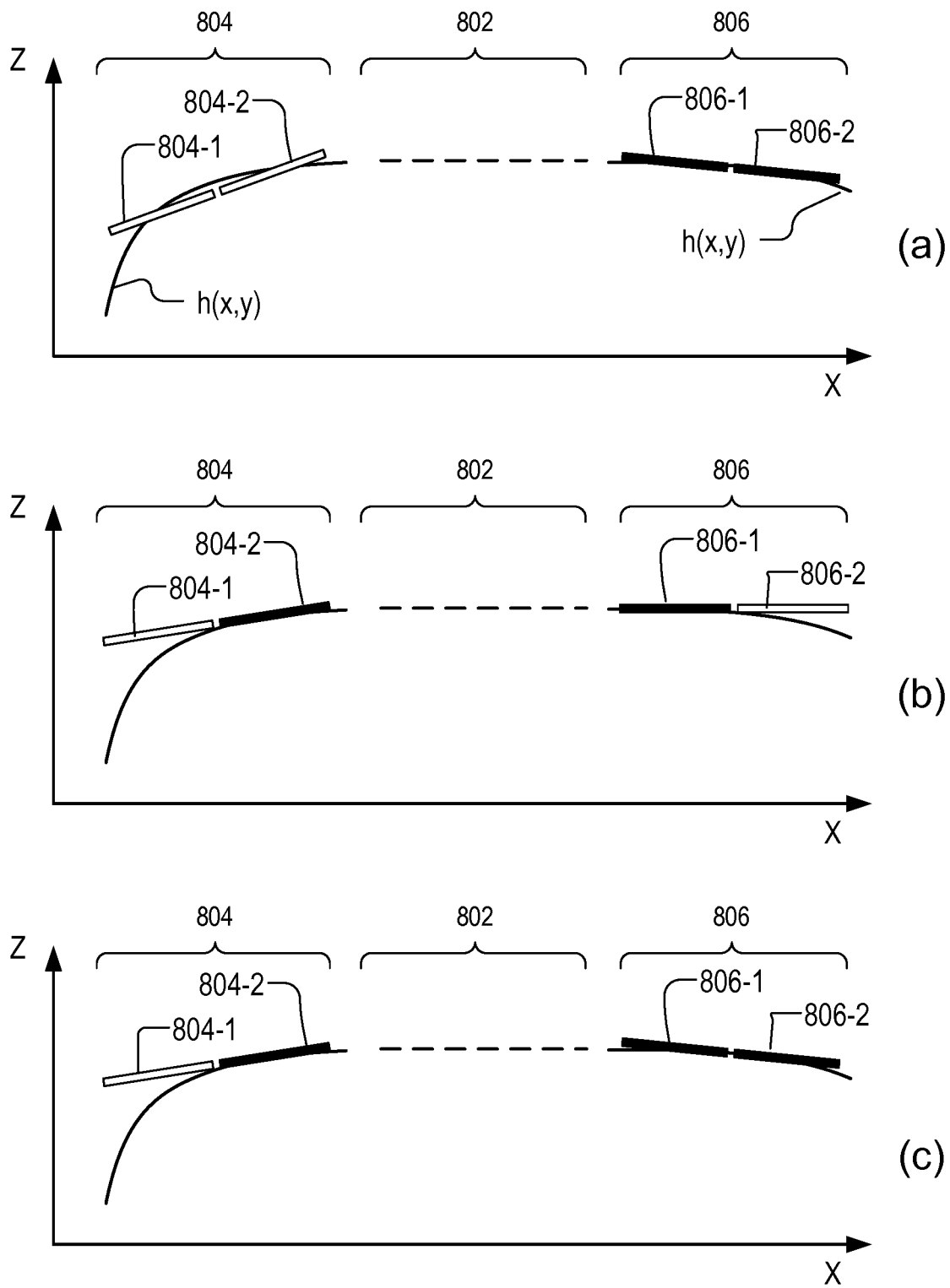
FIG. 8 illustrates schematically the yield of working and non-working products using the example height map of FIG. 7 using (a) the conventional control algorithm of FIG. 5, (b) the known solution of FIG. 6 and (c) an alternative solution disclosed in the present application.

FIG. 8 illustrates this effect in an example in which a central region is labeled 802. Edge roll-off is pronounced in a first peripheral region containing a first field area 804, but not so pronounced in a second peripheral region containing a second field area 806. The height map data h(x,y) illustrates this, in the same manner as in FIG. 5(b)(and FIG. 6(b). The regions 802, 804, 806 may be related for example to the regions 702, 704, 706 in the example of FIG. 7. It is assumed for simplicity that (in this cross-sectional view) each field area 804, 806 spans two device areas. Two bars represent the plane of the image slit 500 over these two device areas. Each bar is colored white if the die is non-yielding due to large focus error, and colored black if the die is yielding due to low focus error.

FIG. 8(a) illustrates yield using the conventional control method. Field areas within central region 802 are assumed to yield good dies. In field 804, device areas 804-1 and 804-2 are non-yielding because the focus control method is unable to achieve good focus across the slit in the presence of the steep height variations (edge roll-off). However, in the second peripheral field 806, both device areas 806-1 and 806-2 yield good dies, because the edge roll-off is only weakly present.

FIG. 8(b) illustrates yield using the method of FIG. 6 in the same circumstances. As explained above, height map data from peripheral device areas is excluded from (ignored in) the focus control calculations, and in FIG. 8 we assume that height data from device areas 804-1 and 806-2 is excluded. In this way, device area 804-2 becomes yielding where it was not in FIG. 8(a). On another part of the substrate, however, the device area 806-2 that was yielding in the method of FIGS. 5 and 8(a) is sacrificed and becomes non-yielding in the method of FIGS. 6 and 8(b).

To improve yield more consistently in the presence of edge effects that may not be uniform around the substrate, a different method is now disclosed. As illustrated in FIG. 8(c), the disclosed method obtains the beneficial result that device area 804-2 becomes yielding where it was not yielding before, while also maintaining yield in both device areas 806-1 and 806-2.

Figure 9:
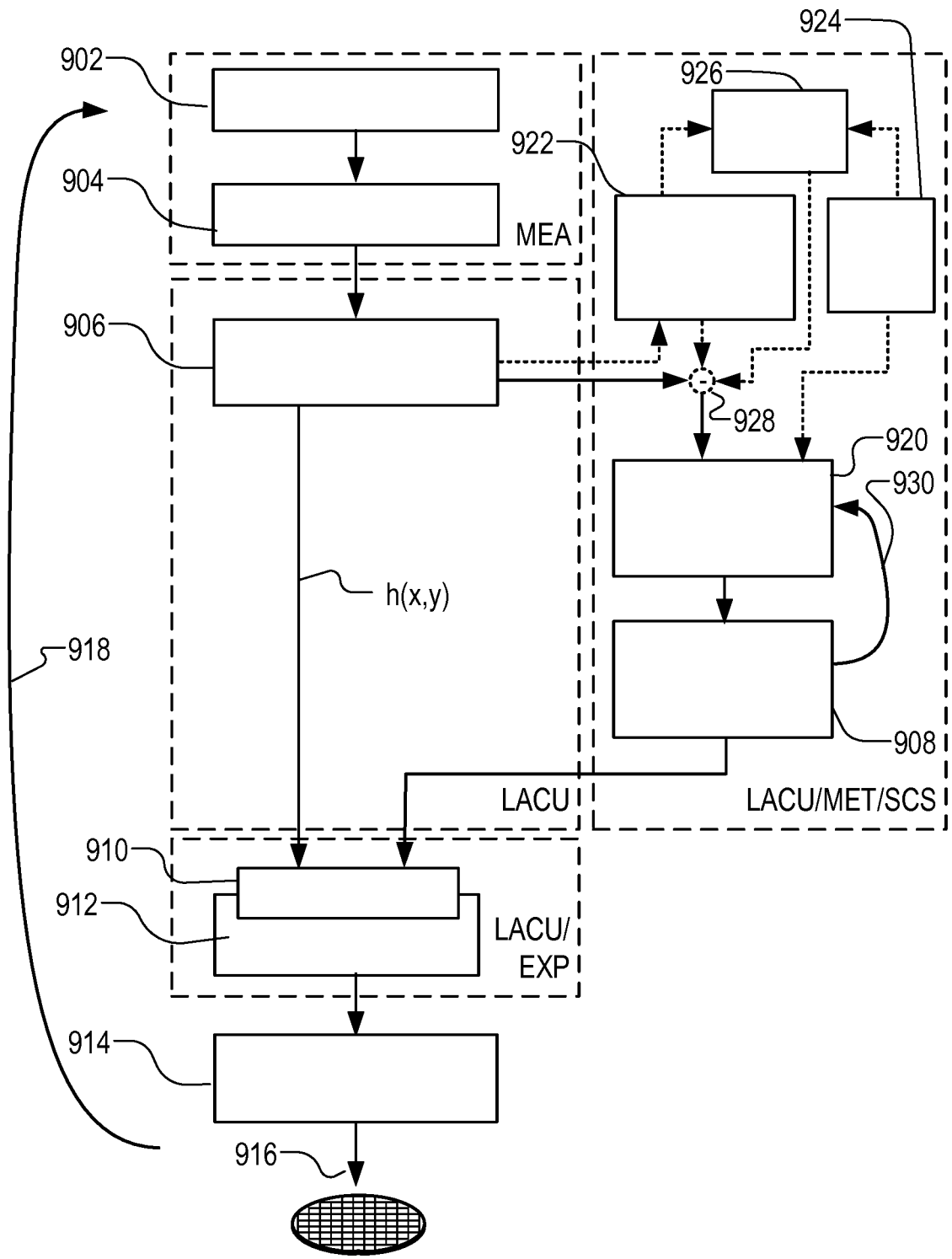
FIG. 9 is a flowchart of operation of the lithographic apparatus and associated metrology and control systems, implementing the alternative solution of FIG. 8(c).

FIG. 9 is a flowchart representing schematically a device manufacturing method giving the result shown in FIG. 8(c). To implement this method, a modified control program may be loaded into the lithographic apparatus control unit LACU in order to implement the steps that follow. Steps at the left hand side in FIG. 9 are expected to be performed in the lithographic apparatus LA under control of the control unit so programmed. Steps at the right hand side in FIG. 9 may be performed wholly or partially in the control unit LACU, wholly or partially in a metrology apparatus 240 (FIG. 2) and/or wholly or partially in the supervisory control system 238 or other performance control system (not shown). Not illustrated in this figure are various off-line setup procedures that may be undertaken.

In the "online" manufacturing process, at 902 a substrate (for example a semiconductor wafer) is loaded into the measurement station MEA of the lithographic apparatus. At 904 the height sensor is used in the manner described in FIG. 3 to obtain measurement signals S(x,y) related to a height of the substrate surface at many locations across the substrate. At 906 a processor (for example a main processor of the control unit LACU or a separate processor associated with the height mapping function) receives the measurement signals and derives a height value for each point on the substrate by converting said measurement signals into local height values using a suitable algorithm. In this way, a height map is obtained, extending over the whole substrate. At this stage, anomalous signals caused, for example, by noise in the apparatus may be detected and eliminated, so that the height map accurately represents the physical features across the wafer.

At step 908, the apparatus defines which product areas are to have their height map data ignored for the purpose of focus control. Different ways in which this step can be implemented will be presented in more detail below. At 910 focus control is performed using the height map to control focusing of the projection system while at 912 the substrate is being exposed in the exposure station EXP.

After the pattern has been applied to all fields on the substrate, at 914 the resist layer carrying the transferred pattern is developed and then subjected to whatever chemical and physical processes are required to form the device features in the underlying material. The process steps will vary depending on the application. After step 914, the devices on the substrate may be complete (916), or the substrate may return to step 902 for patterning and processing further layers (918).

For each repetition, the method in some examples determines dynamically for each layer which device areas are to be ignored in the focus control. In other examples the method may apply the same selection of areas to be ignored that was determined for a previous layer. For example, the selection may be determined in advance with regard to a most critical layer, and the same selection applied in applying all layers.

In the method of FIGS. 6 and 8(b) the device areas to be excluded would be defined in step 908 simply by reference to their radial position on the substrate. In the method of FIG. 9, however, the selection of device areas to be excluded is determined based on measurements made at the corresponding device area and field location on the present substrate and/or on one or more prior substrates. Reference to prior substrates will be understood to mean substrates undergoing the same or similar processing, with the same or similar product designs.

In a first type of example, based on a "dynamic exclusion" approach, the selection is based at least partially on measurements such as a height map for the current layer on the current substrate, not only on measurements of prior substrates or layers. In some processes, the amount of defocus during exposure of a certain area will influence the topography in that area during later processing (i.e. in subsequent patterning steps in the same layer or in higher layers). In those cases, the selection of device areas to be excluded in preceding layers will influence the topography of later layers. In one example of the dynamic exclusion approach, a strategy for such a process would be to minimize the die exclusion induced topography, while still meeting the height specification on all non-excluded dies. This can be achieved by doing the exclusion per layer directly based on the current height map. Criteria for selection may or may not vary between layers, depending for example on how sensitive a particular layer is to defocus.

In another type of example, based on a "static exclusion" approach, the selection is made on a statistical combination of measurements from prior substrates. This may be advantageous for example to reduce the influence of random variations (noise) and to avoid the need for time-consuming calculations per wafer. The calculation can be made once for a lot (batch) of wafers, or for a whole production run. The prior substrates may for example be ones processed in a development phase of a new product and process. The calculated selection is then encoded in a production "recipe" by which the lithographic process for that product is produced in high volume. The selection in the production recipe need not remain fixed forever. It may be updated to maximize yield as the process develops and performance improves. For example, process improvements may change in which sectors of the substrate periphery are subject to edge roll-off. Similarly, the selection can be updated in the course of a production run, to maximize yield as process performance in other respects may improve with time. Automatic or manual monitoring of performance improvements can be implemented, and used to trigger an update to the recipe at a suitable time. Improvement of the selection may be integrated for example with other advanced process control loops implemented for example on a daily or weekly basis.

Referring to the right hand portion of FIG. 9, various options can be considered in more detail, for the implementation of the selection of device areas to be excluded for the purpose of focus control at each field location.

In some embodiments, a step 920 is performed to predict focus error and or yield for each device area, based on a candidate selection of device areas to be excluded. Different candidate selections can be considered, and the one which offers the highest number of yielding dies can be chosen in step 908.

In order to predict performance in step 920, different types of measurement can be considered for use. In a first example, height map measurements taken from one or more prior substrates are collected at 922. These historic height maps show the topographical variation across a sample of real substrates in the condition there were in prior to applying a similar field pattern to the one to be applied in the step 912. Using the illustrations of FIGS. 5 and 6 for the purpose of explanation, it will be seen that focus error can be predicted based on a height map h(x,y), a known slit dimension and a known focus control algorithm. FIG. 5(a) for example indicates a candidate selection in which no device areas are excluded, while FIG. 5(b) indicates a predicted performance of large focus errors in device areas D4, D5, D6. FIG. 6 (a) illustrates a candidate selection in which device areas D1-D3 and D6 are excluded. FIG. 6(b) predicts large focus errors in device area D6, but lower errors and potentially yielding dies in device areas D4 and D5.

While the known method based on a threshold radius RTH does not permit the selection to vary in response to the predicted performance, the method disclosed herein allows the selection to vary based on the predicted performance for each field position and each device area. Therefore, considering field area 804 in FIG. 8 for illustration, FIG. 8(a) indicates a candidate selection in which no device areas are excluded. Performance in device areas 804-1 and 804-2 is predicted to yield no good dies. FIG. 8(b) indicates a candidate selection in which device area 804-1 is excluded. One good die is predicted (804-2). Consequently, the candidate selection that excludes device area 804-1 is chosen for use in controlling imaging over field area 804. Considering, on the other hand, candidate selection (a) in which no device areas are excluded is predicted to yield two good dies, while candidate selection (b) in which device area 806-2 is excluded is predicted to yield only one good die. Consequently, the candidate selection that excludes no device areas is chosen for controlling imaging over field area 806.

It will be understood that the one-dimensional cross-sections of FIG. 8 are simplified and the real focus control method may need to take into account performance in two dimensions. This is readily implemented by the skilled person. In a scanning mode of operation, in fact performance in the device areas is much more strongly coupled in the slit direction (X) than it is in the scanning direction (Y). This can be taken into account in the method of defining candidate selections and predicting performance.

Returning to FIG. 9, in other examples, the measurements used to determine the selection of device areas to be excluded include performance measurements taken from one or more prior substrates after applying a similar field pattern to the prior substrates. As indicated at 924, data from metrology apparatus 240 may be obtained for use instead of or in addition to height map data 922 in determining the selection of device areas to be excluded. For example focus metrology targets may be provided as part of the field pattern, and actual focus performance may be measured from substrates that have had the pattern applied. Other parameters of performance such as CD (linewidth) or side wall angle may also be used as an approximation for focus performance. Whatever actual measurement is used, it will be understood that the step 920 may use data measuring actual performance, instead of or in addition to performance predicted from measured data such as height map data 922. In either case, the predicted or measured performance can be used to determine whether a device area passes a performance test. Specifically the performance test is designed to judge whether a die to which the device area relates will yielding a working product or not. Of course such a determination is made with a margin of uncertainty.

Another input to the performance prediction step 920 may be device-specific topography data 926. Some types of device exhibit large topographic variations as features of their structure, not only as a consequence of undesirable effects such as edge-roll-off. Therefore in some examples, the measurement data are adjusted to compensate for device-specific topography before being used to select device areas to be ignored. The adjustment may happen in the measurement data, or in the prediction of performance.

In one example, the historic height map data 922 is analyzed to identify device-specific topographic variations. For example, height map data from a plurality of field areas on one or more substrates can be combined in a suitable averaging algorithm, to identify topographic variations that are common to all field areas. The result of this averaging is an intra-field height map 926 which is then subtracted from the height map data 922 at 928 to obtain an adjusted height map. The adjusted height map then shows the edge roll-off more clearly, and can be used to predict performance for selecting the device areas to be excluded.

Based on the principles and mechanisms described above, the skilled person can design step 908 so as to maximize a number of device areas passing a performance test at each field location. The method of step 908 may comprise an iterative process. In such a process a candidate selection of device areas to be excluded may be defined, and performance (yield) predicted or measured on the basis of the candidate selection. If certain device areas remain non-yielding, the candidate selection can be updated to exclude the worst of those areas. Performance can then be estimated or measured for the updated candidate selection, and the process repeated until a maximum number of yielding device areas is reached. This iterative process is indicated by the loop 930.

In one example, the method for each field location comprises the steps:
1. Based on a candidate selection of device areas, identifying one or more device areas that fail a performance test;
2. If any device areas fail the performance test, updating the candidate selection of device areas to exclude one or more of the identified device areas and repeating step 1;
3. If no device areas fail the performance test adopting the candidate selection of device areas as the selection of device areas to be used in controlling imaging the field pattern onto new substrates.

Although in principle the method described here could be performed for all field locations across the substrate, in one embodiment the step 908 is performed only for field areas at or near the edge of the substrate. For example, a threshold radius could be set, within which no device areas are excluded. Then, for field areas extending outside the threshold radius, calculation of a selection of device areas to be excluded is performed, in the manner proposed above. The threshold radius can be expressed as either a radius from the substrate center, or a radial distance from the substrate edge. Optionally, a second threshold radius could be set, beyond which every device area is excluded. The second threshold radius can be set to exclude dies that will never yield, even if height performance test is met. Taking the example of a 300 mm wafer, when the second threshold radius set to 150 mm (0 mm from the edge), then the edge of the wafer is defined. This is based on the observation that these dies are partial dies and cannot yield a working product. The second threshold could be set. for example, to 148 mm (2 mm from the edge). This would be based on the observation that (in a given process), the process is so badly controlled in any area within 2 mm of the wafer edge that dies can never yield. This second threshold can be used for example to set the initial candidate selection, to be refined by the iterative process.

As mentioned, the selection of device areas to be excluded for each field location could be made once and applied to all substrates in a for a product run. Moreover, once the selection of the device areas to be excluded has been determined for one layer in the manufacture of a product, the same selection can be applied in the patterning of all layers. Different layers and field patterns have different sensitivity to focus error. However, once a die (device area) has been sacrificed in any layer, then focus performance in any prior and/or subsequent layer may be improved by ignoring height map data for the that device area.

In an example where a product is being formed in multiple layers on the substrate, the selection of device areas to be ignored in relation may be performed in relation to a first layer or a group of layers. This selection may then be retained and used in the formation of one or more other layers. Those other layers could be layers formed before and/or after the first layer in a production sequence. The first layer may be chosen because it is the most sensitive to focus, and/or because it is at a stage in the manufacturing process at which edge roll-off becomes a significant factor in focus performance and yield. In examples where the selection is based on measurement data obtained from a current substrate, then it may be that the selection is applied only to the first layer and/or subsequent layer In an embodiment, there is provided a method of controlling a lithographic apparatus to manufacture a plurality of devices on a substrate, the method comprising: (a) obtaining a height map representing a topographical variation across the substrate; and (b) using the height map to control imaging of a field pattern at multiple field locations across the substrate, the field pattern comprising a plurality of individual device areas, wherein for at least a subset of field locations in step (b) the height map data is used selectively so as to ignore topographical variations in one or more of the individual device areas, and wherein the method further comprises: (c) selecting whether a device area is to be ignored in step (b) based at least partly on measurements made at the corresponding device area and field location on one or more substrates.

In an embodiment, in step (c) the measurements used include height map measurements represented in the height map obtained in step (a). In an embodiment, in step (c) the measurements used include height map measurements taken from one or more prior substrates prior to applying a similar field pattern to the prior substrate(s). In an embodiment, in step (c) the measurements used include focus performance measurements taken from one or more prior substrates after applying a similar field pattern to the prior substrate(s). In an embodiment, in step (c) the measurements are adjusted to compensate for device-specific topography before being used to select device areas to be ignored. In an embodiment, step (c) is performed so as to maximize a number of device areas passing a performance test at each field location. In an embodiment, step (c) comprises, for a given field location, the steps: (c1) based on a candidate selection of device areas, identifying one or more device areas that fail a performance test; (c2) if any device areas fail the performance test, updating the candidate selection of device areas to exclude one or more of the identified device areas and repeating step (c1); (c3) if no device areas fail the performance test adopting the candidate selection of device areas as the selection of device areas to be used in step (b). In an embodiment, the performance test is based on a prediction of focus error in each device area. In an embodiment, the steps (b) and (c) are performed only for peripheral field locations on the substrate. In an embodiment, the steps (b) and (c) are performed in relation to a first layer when a product is being formed in multiple layers on the substrate, and wherein the selection of device areas to be ignored in relation to the first layer is retained and used in the formation of one or more other layers.

In an embodiment, there is provided an apparatus for controlling lithographic processing in which substrates are subjected to lithographic processing, the apparatus comprising a data processing apparatus programmed to perform the steps of: receiving measurements of substrates that have been subjected to lithographic processing over a plurality of field areas, each field area comprising a plurality of device areas; for at least a subset of field locations using the measurements to select one or more of the device areas to be ignored in the operation of a lithographic apparatus; and providing recipe data identifying for each of the field locations the device areas for which topographical variations are to be ignored, when controlling imaging of a pattern onto a substrate.

In an embodiment, there is provided a computer program product comprising machine readable instructions for causing a general purpose data processing apparatus to perform the steps of a method as described herein.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The descriptions above are intended to be illustrative, not limiting. Thus, it will be apparent to one skilled in the art that modifications may be made to the invention as described without departing from the spirit and scope of the claims set out below. In addition, it should be appreciated that structural features or method steps shown or described in any one embodiment herein can be used in other embodiments as well.

The invention claimed is:

1. A method of controlling a lithographic apparatus to manufacture a plurality of devices on a substrate, the method comprising:
   (a) obtaining a height map representing a topographical variation across the substrate;
   (b) using the height map to control imaging of a field pattern at multiple field locations across the substrate, the field pattern comprising a plurality of individual device areas, wherein for at least a subset of the field locations in step (b) the height map data is used selectively so as to ignore measured topographical variations in one or more of the individual device areas for one or more functional devices or ignore determined topographical variations in one or more of the individual device areas for one or more functional devices, the determined topographical variations determined from measurements; and
   (c) selecting whether the measured or determined topographical variations in a device area of the one or more of the individual device areas are to be ignored in step (b) based at least partly on measurements made at the corresponding device area and field location on one or more substrates, wherein step (c) is performed so as to maximize a number of device areas passing a performance test at each field location, the performance test being based on a prediction of focus error in each device area.

2. The method as claimed in claim 1, wherein in step (c) the measurements used include height map measurements represented in the height map obtained in step (a).

3. The method as claimed in claim 1, wherein in step (c) the measurements used include height map measurements taken from one or more prior substrates prior to applying a similar field pattern to the prior substrate(s).

4. The method as claimed in claim 1, wherein in step (c) the measurements used include focus performance measurements taken from one or more prior substrates after applying a similar field pattern to the prior substrate(s).

5. The method as claimed in claim 1, wherein in step (c) the measurements are adjusted to compensate for device-specific topography before being used to select the one or more device areas to be ignored.

6. The method as claimed in claim 1, wherein step (c) comprises, for a given field location, the steps:
   (c1) based on a candidate selection of device areas, identifying one or more device areas that fail a performance test;
   (c2) responsive to any device areas failing the performance test, updating the candidate selection of device areas to exclude one or more of the identified device areas and repeating step (c1);
   (c3) responsive to no device areas failing the performance test, adopting the candidate selection of device areas as the selection of device areas to be used in step (b).

7. The method as claimed in claim 1, wherein the steps (b) and (c) are performed in relation to a first layer when a product is being formed in multiple layers on the substrate, and wherein the selection of device areas to be ignored in relation to the first layer is retained and used in the formation of one or more other layers.

8. The method as claimed in claim 1, wherein a threshold radius is set within which no device areas are excluded.

9. An apparatus configured to control lithographic processing in which substrates are subjected to lithographic processing, the apparatus comprising a data processing apparatus programmed to at least:
   receive measurements of substrates that have been subjected to lithographic processing over a plurality of field areas, each field area comprising a plurality of device areas;

use the measurements to select one or more of the device areas for one or more functional devices for which measured topographical variations for the one or more of the device areas are to be ignored in the operation of a lithographic apparatus or for which determined topographical variations for the one or more of the device areas are to be ignored in the operation of a lithographic apparatus, the determined topographical variations determined from measurements; and provide recipe data identifying, for each of the field locations, the one or more device areas for which measured or determined topographical variations are to be ignored, when controlling imaging of a pattern onto a substrate so as to maximize a number of device areas passing a performance test at each field location, the performance test being based on a prediction of focus error and/or yield in each device area.

10. A non-transitory computer program product comprising machine readable instructions configured to cause a data processing apparatus to at least:
(a) obtain a height map representing a topographical variation across a substrate;
(b) use the height map to control imaging of a field pattern by a lithographic apparatus at multiple field locations across the substrate, the field pattern comprising a plurality of individual device areas, wherein for at least a subset of the field locations in operation (b) the height map data is used selectively so as to ignore measured topographical variations in one or more of the individual device areas for one or more functional devices or ignore determined topographical variations in one or more of the individual device areas for one or more functional devices, the determined topographical variations determined from measurements; and
(c) select whether the measured or determined topographical variations in a device area of the one or more of the individual device areas are to be ignored in operation (b) based at least partly on measurements made at the corresponding device area and field location on one or more substrates, wherein operation (c) is performed so as to maximize a number of device areas passing a performance test at each field location, the performance test being based on a prediction of focus error in each device area.

11. The computer program as claimed in claim 10, wherein in operation (c) the measurements used include height map measurements represented in the height map obtained in operation (a).

12. The computer program as claimed in claim 10, wherein in operation (c) the measurements used include height map measurements taken from one or more prior substrates prior to applying a similar field pattern to the prior substrate(s).

13. The computer program as claimed in claim 10, wherein in operation (c) the measurements used include focus performance measurements taken from one or more prior substrates after applying a similar field pattern to the prior substrate(s).

14. The computer program as claimed in claim 10, wherein in operation (c) the measurements are adjusted to compensate for device-specific topography before being used to select one or more device areas to be ignored.

15. The method as claimed in claim 14, wherein a further threshold radius is set beyond which every device area is excluded.

16. The computer program as claimed in claim 10, wherein operation (c) comprises, for a given field location, the operations:
(c1) based on a candidate selection of device areas, identify one or more device areas that fail a performance test;
(c2) responsive to any device areas failing the performance test, update the candidate selection of device areas to exclude one or more of the identified device areas and repeating operation (c1);
(c3) responsive to no device areas failing the performance test, adopt the candidate selection of device areas as the selection of device areas to be used in operation (b).

17. The computer program as claimed in claim 10, wherein operations (b) and (c) are performed in relation to a first layer when a product is being formed in multiple layers on the substrate, and wherein the selection of one or more device areas to be ignored in relation to the first layer is retained and used in the formation of one or more other layers.

18. A non-transitory computer program product comprising machine readable instructions configured to cause a data processing apparatus to at least:
receive measurements of substrates that have been subjected to lithographic processing over a plurality of field areas, each field area comprising a plurality of device areas;
use the measurements to select one or more of the device areas for one or more functional devices for which measured topographical variations for the one or more of the device areas are to be ignored in the operation of a lithographic apparatus or for which determined topographical variations for the one or more of the device areas are to be ignored in the operation of a lithographic apparatus, the determined topographical variations determined from measurements; and
provide recipe data identifying, for each of the field locations, the one or more device areas for which measured or determined topographical variations are to be ignored, when controlling imaging of a pattern onto a substrate so as to maximize a number of device areas passing a performance test at each field location, the performance test being based on a prediction of focus error and/or yield in each device area.

19. The computer program as claimed in claim 18, wherein the measurements used include height map measurements represented in a height map of the substrate or include height measurements taken from one or more prior substrates prior to applying a similar field pattern to the prior substrate(s).

20. The computer program as claimed in claim 18, wherein the measurements are adjusted to compensate for device-specific topography before being used to select one or more device areas to be ignored.

* * * * *